United States Patent
Bae

(10) Patent No.: US 7,618,887 B2
(45) Date of Patent: Nov. 17, 2009

(54) SEMICONDUCTOR DEVICE WITH A METAL LINE AND METHOD OF FORMING THE SAME

(75) Inventor: Se-Yeul Bae, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 237 days.

(21) Appl. No.: 11/304,771

(22) Filed: Dec. 16, 2005

(65) Prior Publication Data

US 2006/0131756 A1    Jun. 22, 2006

(30) Foreign Application Priority Data

Dec. 16, 2004    (KR)    .................. 10-2004-0106940

(51) Int. Cl.
*H01L 21/20* (2006.01)
(52) U.S. Cl. .................. 438/622; 438/636; 438/640; 438/678; 438/687; 438/704; 257/E21.171; 257/E21.179; 257/E21.252; 257/E21.579; 257/E21.586; 257/E23.145
(58) Field of Classification Search ......... 438/622–640, 438/614, 678, 687, 704; 257/E21.171, 179, 257/252, 253, 259, 262, 295, 579, 586, E23.145
See application file for complete search history.

(56) References Cited

U.S. PATENT DOCUMENTS

| | | | | |
|---|---|---|---|---|
| 6,037,664 A * | 3/2000 | Zhao et al. | .................. | 257/758 |
| 6,153,514 A * | 11/2000 | Wang et al. | .................. | 438/640 |
| 6,211,069 B1 * | 4/2001 | Hu et al. | .................. | 438/637 |
| 6,284,657 B1 * | 9/2001 | Chooi et al. | .................. | 438/687 |
| 6,489,233 B2 * | 12/2002 | Chooi et al. | .................. | 438/637 |
| 6,492,263 B1 * | 12/2002 | Peng et al. | .................. | 438/639 |
| 6,492,270 B1 * | 12/2002 | Lou | .................. | 438/687 |
| 6,521,524 B1 * | 2/2003 | Wang et al. | .................. | 438/637 |
| 6,686,271 B2 * | 2/2004 | Raaijmakers et al. | .................. | 438/633 |
| 7,119,006 B2 * | 10/2006 | Kraft | .................. | 438/622 |
| 7,271,087 B2 * | 9/2007 | Chun | .................. | 438/622 |
| 2003/0060037 A1 * | 3/2003 | Wu | .................. | 438/637 |
| 2007/0134917 A1 * | 6/2007 | Li et al. | .................. | 438/637 |

FOREIGN PATENT DOCUMENTS

| | | |
|---|---|---|
| JP | 2001-168188 | 6/2001 |
| JP | 2003-31660 | 1/2003 |
| KR | 2001-0017903 | 3/2001 |

* cited by examiner

*Primary Examiner*—Michael S Lebentritt
(74) *Attorney, Agent, or Firm*—Lowe Hauptman Ham & Berner, LLP

(57) ABSTRACT

A method of forming a metal line in a semiconductor device including forming a first insulation layer and a first etch stop layer on a conductive layer, and forming a first photosensitive layer pattern on the first etch stop layer; forming a first opening by etching the first etch stop layer; forming a second insulation layer and a second etch stop layer on the first insulation layer and the first etch stop layer, and forming a second photosensitive layer pattern on the second etch stop layer; forming a second opening by etching the second etch stop layer; simultaneously forming an inter-connection groove and a via hole by etching the first insulation layer and the second insulation layer using the second etch stop layer and the first etch stop layer as a mask; and forming a metal line by filling the inter-connection groove and the via hole with conductive materials.

10 Claims, 9 Drawing Sheets

SEMICONDUCTOR DEVICE WITH A METAL LINE AND METHOD OF FORMING THE SAME

CROSS-REFERENCE TO RELATED APPLICATION

This application claims priority to and the benefit of Korean Patent Application No. 10-2004-0106940 filed in the Korean Intellectual Property Office on Dec. 16, 2004, the entire contents of which are incorporated herein by reference.

BACKGROUND OF THE INVENTION (a) Field of the Invention

The present invention relates to a semiconductor device with a metal line and a method of forming the same. More particularly, the present invention relates to a metal line in a semiconductor device and a method of forming the same by using a low-k (low dielectric constant) insulation layer.

(b) Description of the Related Art

As semiconductor devices have become highly integrated, logic devices are also required to have higher speed and higher integration. In order to enhance integration of a semiconductor device, metal lines therein are required to be miniaturized.

However, a higher speed of a semiconductor device is not easily achieved due to line delay.

An aluminum alloy is conventionally used as a wiring material in LSI (Large Scale Integration), but copper (Cu) has recently been used as a wiring material in LSI because copper has low resistivity and high strength against EM (electromigration).

However, since copper is hard to etch and since it can be oxidized during manufacturing processes, a damascene process has recently been used for forming a copper line.

A damascene process is performed by the following steps; firstly, an inter-connection groove in which an upper wire will be formed is formed on an insulation layer, and a via hole connecting the upper wire with a lower wire or substrate is also formed on an insulation layer; and secondly, a metal line is formed by performing a CMP (Chemical Mechanical Polishing) process for copper which is filled in the inter-connection groove and via hole.

A low-k (low dielectric constant) insulation layer is used with a copper line in such a damascene process, because it may increase the speed of a device by reducing a parasitic capacitance between metal lines and reduce cross-talk of a device.

Hereinafter, a conventional method of forming a metal line in a semiconductor device using a dual damascene process will be described with reference to FIG. 1A to FIG. 1F.

FIG. 1A to FIG. 1F are cross-sectional views showing sequential states of a method of forming a metal line in a semiconductor device using a dual damascene process.

Referring to FIG. 1A, a lower conductive layer 110, an etch stop layer 120, a lower insulation layer 130, and an upper insulation layer 140 are sequentially formed.

Referring to FIG. 1B, a photosensitive layer pattern 150 having an opening D1-1 for a via hole is formed on the upper insulation layer 140.

However, when a lithography process is performed for the photosensitive layer pattern 150, a photoresist tail (not shown) may be created thereon. A photoresist tail may occur when a via hole is miniaturized due to miniaturization of a metal line, when a depth of a via hole to be etched is increased, and when a thickness of a photosensitive layer used as an etching barrier is also increased.

As shown in FIG. 1C, a via hole is formed up to the etch stop layer 120 by selectively etching the upper insulation layer 140 and lower insulation layer 130 while using the photosensitive layer pattern 150 as an etch mask. Thereafter, the photosensitive layer pattern 150 is removed by performing an ashing process.

Referring to FIG. 1D, a photosensitive layer 160 is deposited on the entire surface of the upper insulation layer 140 including the via hole, and the photosensitive layer 160 is left only in the via hole by performing blanket etching. When subsequent processes for forming an inter-connection groove are performed, the photosensitive layer 160 remaining in the via hole is used as a barrier layer for preventing removal of or damage to the etch stop layer 120 below the via hole.

Subsequently, a photosensitive layer pattern 170 having an opening is formed on the upper insulation layer 140. The opening has the same width as a predetermined width D1-2 of an inter-connection groove. Thereafter, the upper insulation layer 140 is etched in the predetermined thickness of a metal line by using the photosensitive layer pattern 170 as an etch mask.

Referring to FIG. 1E, the photosensitive layer pattern 170 and photosensitive layer 160 are removed by an ashing process, and the lower conductive layer 110 is exposed by removing the etch stop layer 120 below the via hole through blanket etching.

According to a conventional method of forming a metal line in a semiconductor device, when the lower insulation layer 130 and the upper insulation layer 140 are formed as low-k (low dielectric constant) insulation layers including an organic polymer, they are damaged by oxygen plasma that is used in two ashing processes for the photosensitive layer patterns 150 and 170.

More particularly, when the lithography process for the photosensitive layer pattern 170 having the same width as an inter-connection groove is not performed properly, a rework process for removing the photosensitive layer pattern should be performed. However, during the rework process, the insulation layers 130 and 140 having an organic polymer are severely damaged because they are already exposed at both sidewalls of the inter-connection groove and the via hole.

Thereafter, as shown in FIG. 1F, a barrier metal layer 180 is formed in the inter-connection groove and the via hole, and a metal line is finally formed by polishing conductive materials filling the inter-connection groove and the via hole through a CMP process.

Such a conventional dual damascene process for forming a metal line may induce a photoresist tail, and it may induce severe damage to an insulation layer during ashing and re-ashing processes.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a semiconductor device with a metal line and a method of forming the same having advantages of using an improved dual damascene process.

An exemplary semiconductor device with a metal line according to an embodiment of the present invention includes: a conductive layer; a first insulation layer that is formed on the conductive layer and has a first opening; an etch stop layer that is formed on the first insulation layer and has a second opening, and protects the first insulation layer from etching; a second insulation layer that is formed on the etch stop layer and has the second opening; a via hole that is connected with the conductive layer and is formed in the first opening; and a metal line that is formed by filling the inter-connection groove and via hole with conductive materials, and that is electrically connected to the conductive layer. The first insulation layer can additionally include a third opening that can be connected to a lower part of the first opening, and composes the via hole with the first opening, and that has a smaller width than the first opening.

The first insulation layer or the second insulation layer having the low-k (low dielectric constant) can be composed of one among a Si—O based inorganic polymer, a carbon-based organic polymer, a fluorine-doped oxide layer, or a carbon-doped oxide layer.

The organic polymer can be composed of at least one among a polyally ether resin, a cyclic fluorine resin, a siloxane copolymer, a fluoro polyally ether resin, a poly pentafluoride styrene resin, a poly tetrafluoride styrene resin, a fluoro polyimide resin, a fluoro poly naphthalene resin, a polycide resin, etc.

The etch stop layer can be formed at a thickness of 5 to 30 nm, and the conductive materials can simultaneously fill in the inter-connection groove and via hole by using a CMP process.

An exemplary method of forming a metal line in a semiconductor device includes: forming a first insulation layer and first etch stop layer on a conductive layer, and forming a first photosensitive layer pattern on the first etch stop layer; forming a first opening for a via hole by etching the first etch stop layer using the first photosensitive layer pattern as a mask; forming a second insulation layer and second etch stop layer on the first insulation layer and first etch stop layer, and forming a second photosensitive layer pattern on the second etch stop layer; forming a second opening for an inter-connection groove by etching the second etch stop layer using the second photosensitive layer pattern as a mask; forming the inter-connection groove and via hole by etching the first insulation layer and second insulation layer using the second etch stop layer and first etch stop layer as a mask; and forming a metal line by filling the inter-connection groove and via hole with conductive materials.

Another exemplary method of forming a metal line in a semiconductor device includes: sequentially forming a first etch stop layer, a first insulation layer, and a second etch stop layer on a conductive layer; forming a first photosensitive layer pattern having a first opening on the second etch stop layer; etching the second etch stop layer by using the first photosensitive layer pattern as a mask to a degree that the first insulation layer is exposed, and then removing the first photosensitive layer pattern; sequentially forming a second insulation layer and a third etch stop layer on the first insulation layer and second etch stop layer, and forming a second photosensitive layer pattern having a second opening on the third etch stop layer; etching the third etch stop layer by using the second photosensitive layer pattern as a mask to a degree that the second insulation layer is exposed, and removing the second photosensitive layer pattern; forming an inter-connection groove and a via hole by sequentially etching the first insulation layer using the third etch stop layer and the second etch stop layer as a mask; forming a spacer insulation layer on the entire surface of a substrate including the inter-connection groove and the via hole; forming a spacer at both sidewalls of the inter-connection groove and the via hole by performing an etch back process using the thickness of the spacer insulation layer as a target; forming a via hole by additionally etching the first insulation layer to a degree that the first etch stop layer is exposed; simultaneously forming the inter-connection groove and via hole by removing the first etch stop layer, the second etch stop layer, the third etch stop layer, and the spacer insulation layer; and forming a metal line by performing a CMP process for polishing conductive materials which fill in the inter-connection groove and the via hole.

The first insulation layer or the second insulation layer having the low-k (low dielectric constant) can be composed of one among a Si—O based inorganic polymer, a carbon-based organic polymer, a fluorine-doped oxide layer, or a carbon-doped oxide layer.

During the forming of the first photosensitive layer pattern and second photosensitive layer pattern, the first insulation layer and the second insulation layer can be protected by the second etch stop layer and the third etch stop layer in a rework process to remove the first photosensitive layer pattern or the second photosensitive layer pattern for performing an additional lithography process.

The inter-connection groove and the via hole can be simultaneously formed by performing etching with the use of the third etch stop layer pattern as a mask.

The inter-connection groove and the via hole having a finer size than a size limit obtained by a lithography process can be formed by adjusting a thickness of the spacer.

Before the conductive materials fill in the inter-connection groove and the via hole, a barrier metal layer can be formed at both sidewalls thereof, and the barrier metal layer may be composed of at least one among Ta, TaN, TiN, WN, TaC, WC, TiSiN, or TaSiN.

DETAILED DESCRIPTION OF THE EMBODIMENTS

Figure 1A:
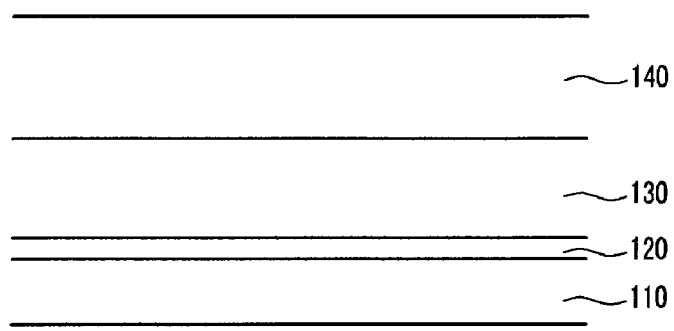
FIG. 1A to FIG. 1F are cross-sectional views showing sequential states of a conventional method of forming a metal line in a semiconductor device using a dual damascene process.
Figure 1B:
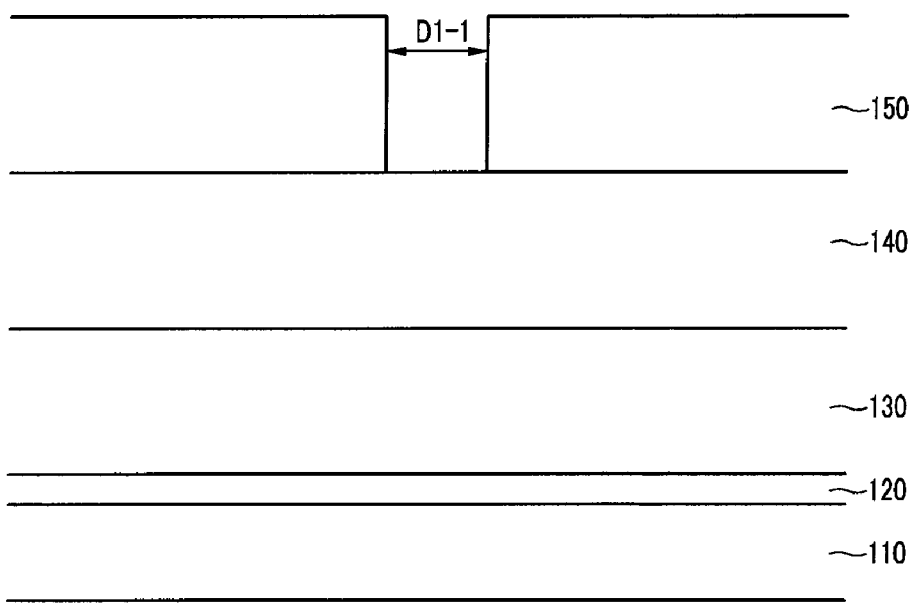
Figure 1C:
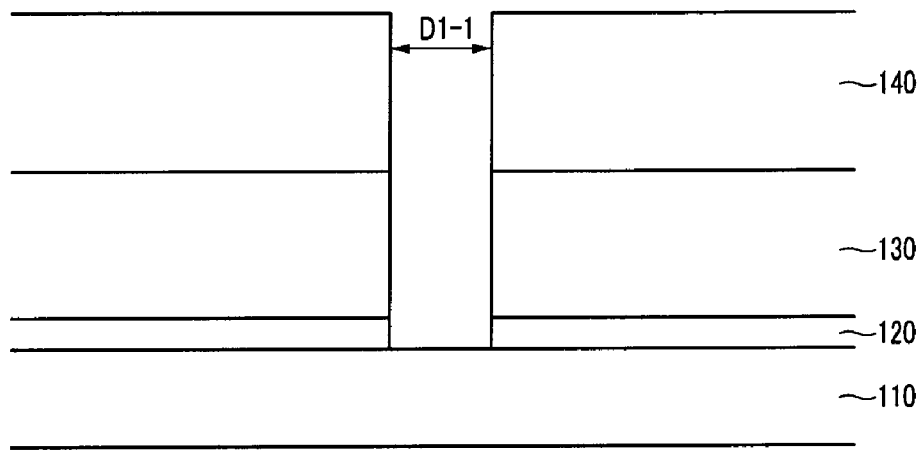
Figure 1D:
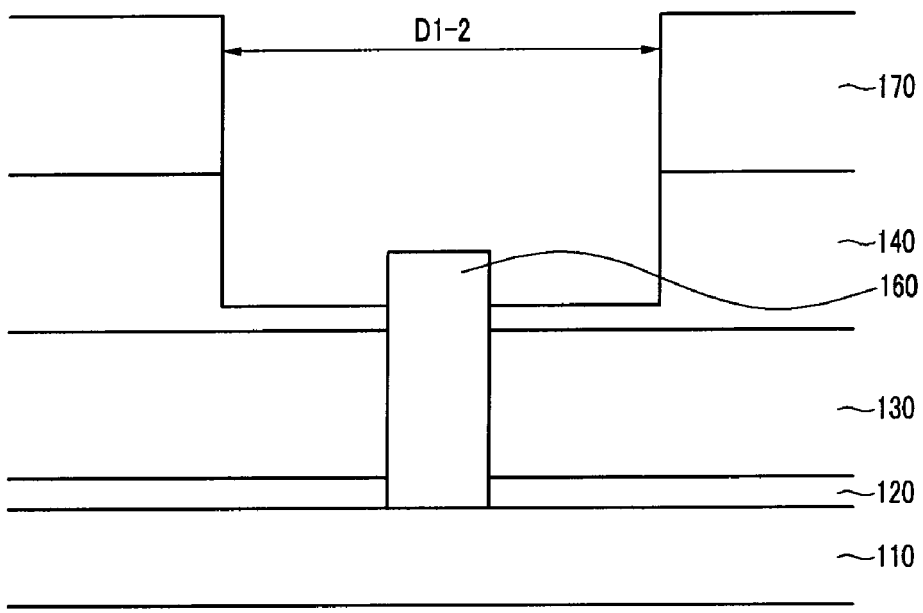
Figure 1E:
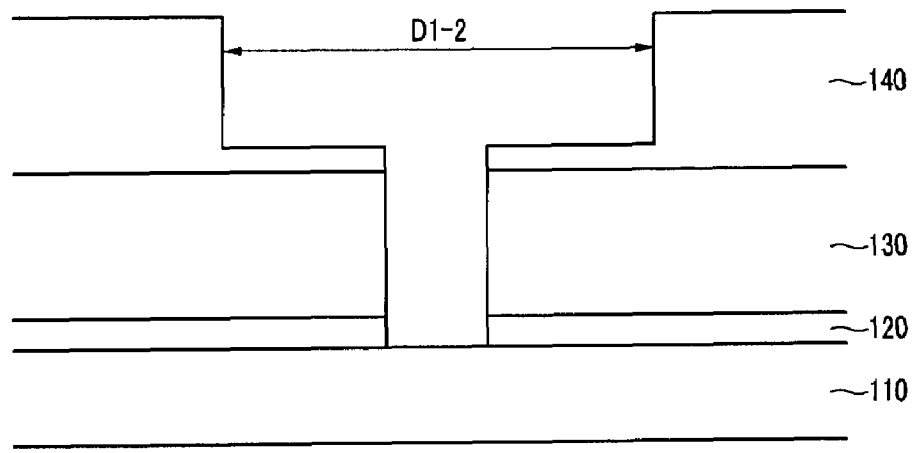
Figure 1F:
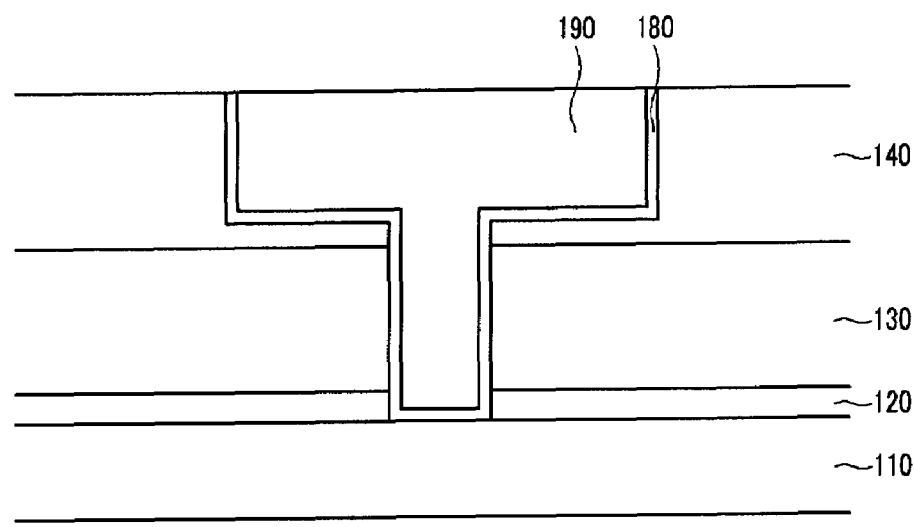

An exemplary embodiment of the present invention will hereinafter be described in detail with reference to the accompanying drawings.

In the following detailed description, only certain exemplary embodiments of the present invention have been shown and described, simply by way of illustration. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate, is positioned on another part, it means the part is directly on the other part or above the other part with at least one intermediate part. On the other hand, if any part is said to be positioned directly on another part it means that there is no intermediate part between the two parts.

Hereinafter, a semiconductor device having a metal line formed by a first exemplary embodiment of the present invention will be described with reference to FIG. 2.

Figure 2:
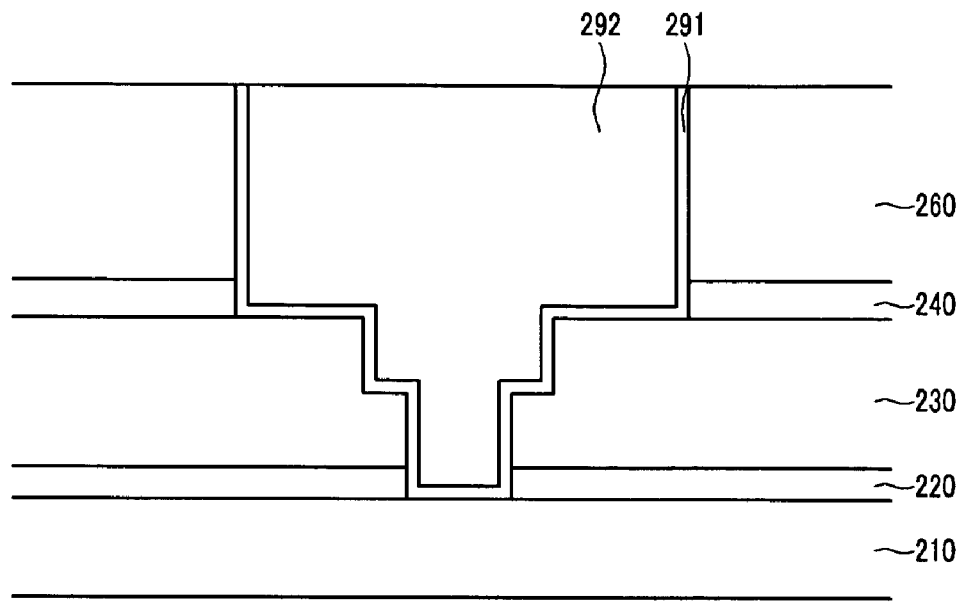
FIG. 2 is a cross-sectional view showing a semiconductor device having a metal line formed by a first exemplary embodiment of the present invention.

FIG. 2 is a cross-sectional view showing a semiconductor device having a metal line formed by a first exemplary embodiment of the present invention.

As shown in FIG. 2, according to a first exemplary embodiment of the present invention, a lower conductive layer 210, a lower etch stop layer 220 having an opening for a via hole, a lower insulation layer 230 having an opening for a via hole, an upper etch stop layer 240 having an opening for an inter-connection groove, and an upper insulation layer 260 having an opening for an inter-connection groove are formed on a semiconductor device including a via hole and a metal line. Subsequently, the via hole and inter-connection groove are filled with a conductive material.

The lower conductive layer 210 is formed of a conductive material, and it can be a semiconductor substrate or a lower metal line in a multi-layered structure. Here, the upper etch stop layer 240 is formed with a relatively small thickness, preferably 5 to 30 nm.

The lower insulation layer 230 is formed as a low-k (low dielectric constant) insulation layer, and the low-k insulation layer is not specifically limited in the first exemplary embodiment of the present invention. That is, a preferable low-k insulation layer includes a Si—O based inorganic polymer, a carbon-based organic polymer, a fluorine-doped oxide layer, or a carbon-doped oxide layer. The organic polymer can include a polyally ether resin, a cyclic fluorine resin, a siloxane copolymer, a fluoro polyally ether resin, a poly pentafluoride styrene resin, a poly tetrafluoride styrene resin, a fluoro polyimide resin, a fluoro poly naphthalene resin, a polycide resin, etc.

The lower insulation layer 230 can be formed by using one among a PECVD (Plasma Enhanced CVD), HDP-CVD (High Density Plasma CVD), APCVD (Atmospheric Pressure CVD), or spin coating scheme.

The conductive material can be composed of at least one among aluminum (Al), an aluminum alloy (Al-alloy), copper (Cu), gold (Au), silver (Ag), tungsten (W), and molybdenum (Mo).

Hereinafter, a method of forming a metal line in a semiconductor device according to a second exemplary embodiment of the present invention will be described with reference to FIG. 3A to FIG. 3K.

FIG. 3A to FIG. 3K are cross-sectional views showing sequential stages of a method of forming a metal line in a semiconductor device according to the second exemplary embodiment of the present invention.

Figure 3A:
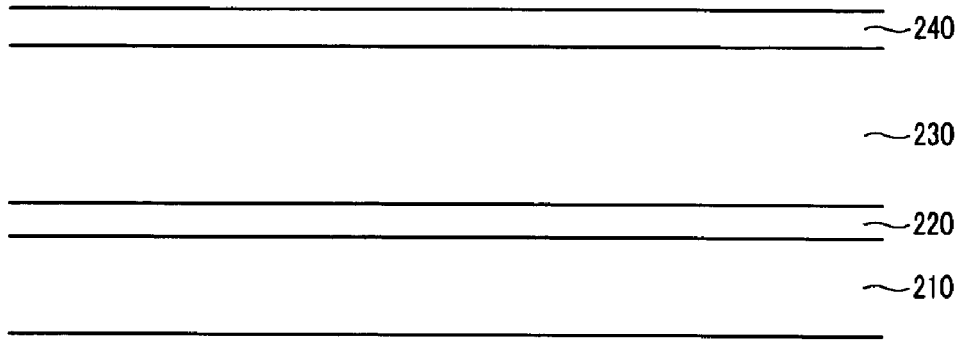
FIG. 3A to 3K are cross-sectional views showing sequential stages of a method of forming a metal line in a semiconductor device according to a second exemplary embodiment of the present invention.

As shown in FIG. 3A, a lower etch stop layer 220, a lower insulation layer 230, and an upper etch stop layer 240 are sequentially formed on a lower conductive layer 210.

Figure 3B:
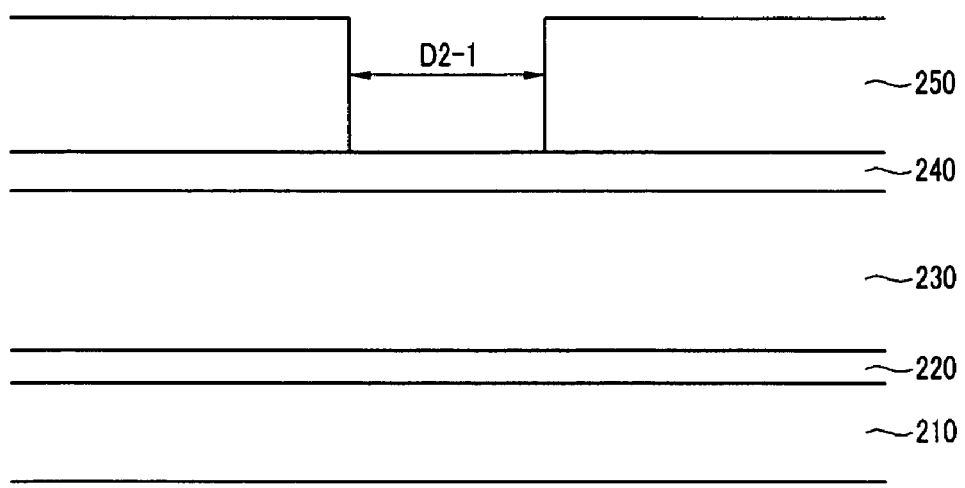

Referring to FIG. 3B, a photosensitive layer pattern 250 having an opening D2-1 for forming a via hole is formed on the upper etch stop layer 240. Here, the opening D2-1 is formed more widely than an actual opening for a via hole.

The photosensitive layer pattern 250 is used as an etch mask when etching the upper etch stop layer 240. Since the upper etch stop layer 240 is formed to a small thickness as described above, and the opening of the photosensitive layer pattern 250 is formed more widely than an actual opening for a via hole, an etching process can be easily performed and a photoresist tail, which can otherwise be created after a lithography process, can be prevented. More specifically, if the upper etch stop layer 240 is formed to a large thickness, a photoresist tail can be created due to strict etching conditions, such as a long etching time. However, according to the second exemplary embodiment of the present invention, since the upper etch stop layer 240 is formed to a small thickness, a photoresist tail can be prevented because strict etching conditions are not required. In addition, the opening D2-1 can be adjusted as necessary. More specifically, the opening D2-1 can be appropriately adjusted according to the thickness of a spacer which is formed in the subsequent process.

Figure 3C:
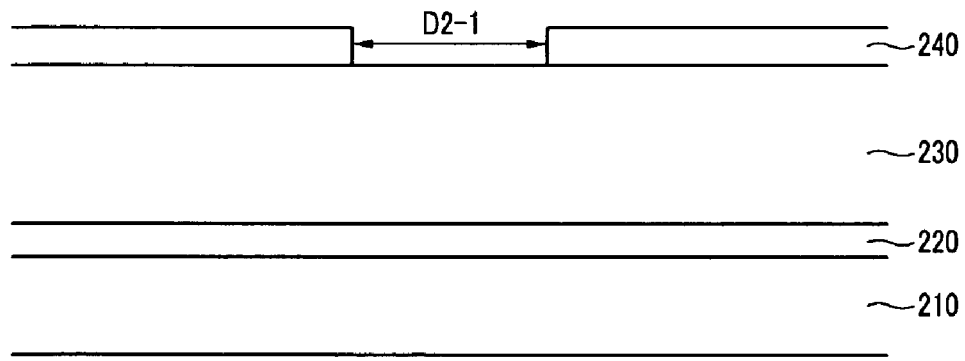

Referring to FIG. 3C, the upper etch stop layer 240 is etched to a degree that the lower insulation layer 230 is exposed by using the photosensitive layer pattern 250 as an etch mask, and then the photosensitive layer pattern 250 is removed by an ashing process. An ashing method for the photosensitive layer pattern 250 is not specifically limited in the second exemplary embodiment of the present invention, but an oxygen plasma ashing method can be used therein.

Figure 3D:
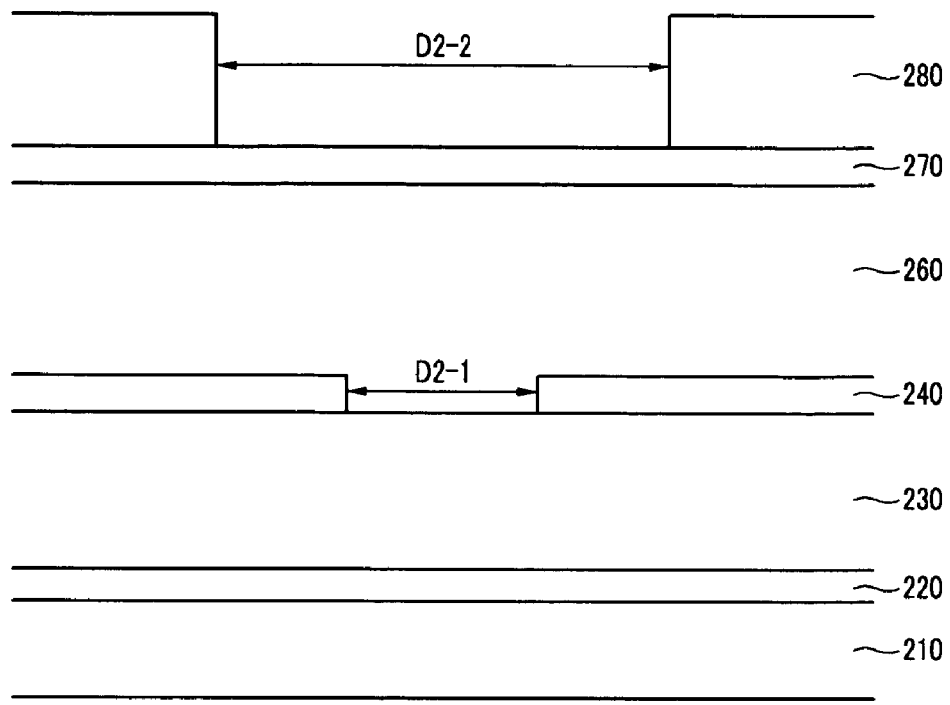

As shown in FIG. 3D, an upper insulation layer 260 and a hard mask layer 270 are sequentially formed on the lower insulation layer 230 and the upper etch stop layer 240, and then a photosensitive layer pattern 280 having an opening D2-2 is formed on the hard mask layer 270. Here, the opening D2-2 can be formed more widely than a predetermined inter-connection groove, and the hard mask layer 270 is formed at a very small thickness.

Since the hard mask layer 270, which is etched by using the photosensitive layer pattern 280 as a mask, is formed to a very small thickness, and the opening D2-2 is formed more widely than a predetermined inter-connection groove, a photoresist tail cannot occur after a lithography process.

According to the conventional method of performing a dual damascene process, the opening D2-1 or D2-2 has the same width as the via hole and the inter-connection groove. However, according to the second exemplary embodiment of the present invention, a photosensitive layer pattern having a wider width than the via hole and inter-connection groove is formed, and then a process for adjusting the width of the via hole and the inter-connection groove is subsequently performed. Consequently, a via hole and an inter-connection groove having a fine width which cannot be obtained by a lithography process can be formed. Hereinafter, the process for adjusting the width of the via hole and the inter-connection groove will be described in detail.

The upper insulation layer 260, like the lower insulation layer 230, is formed as a low-k insulation layer, and it is composed of the same material as that of the lower insulation layer 230.

According to the second exemplary embodiment of the present invention, the upper insulation layer 260 and the lower insulation layer 230 are formed to a thickness large enough for the via hole and inter-connection groove to be formed therein.

According to the second exemplary embodiment of the present invention, the lower insulation layer 230 is protected by the upper etch stop layer 240 that is formed thereon, and the upper insulation layer 260 is protected by the hard mask layer 270 that is formed thereon. More specifically, during the ashing process for removing the photosensitive layer patterns 250 and 280, the lower insulation layer 230 and the upper insulation layer 260 are respectively protected by the upper etch stop layer 240 and the hard mask layer 270.

Here, even if portions of the lower insulation layer 230 and upper insulation layer 260 exposed by the opening D2-1 and D2-2 may be damaged by the ashing process, there are no negative effects for metal lines of a semiconductor device because the exposed portions are finally removed by the subsequent process.

More particularly, when the lithography process for the photosensitive layer pattern 250 and 280 is not properly performed, the rework process for removing the photosensitive layer pattern needs to be performed in order to perform the lithography process again. During the rework process, the upper etch stop layer 240 and the hard mask layer 270 protect the insulation layers 230 and 260. Therefore, the insulation layers 230 and 260 composed of an organic polymer cannot be damaged in the rework process.

Here, the hard mask layer 270, the upper etch stop layer 240, and the lower etch stop layer 220 need to be composed of materials having a strong tolerance for an etching process performed for forming metal lines of a semiconductor device, and according to the second exemplary embodiment of the present invention, they can be composed of silicon nitride.

Figure 3E:
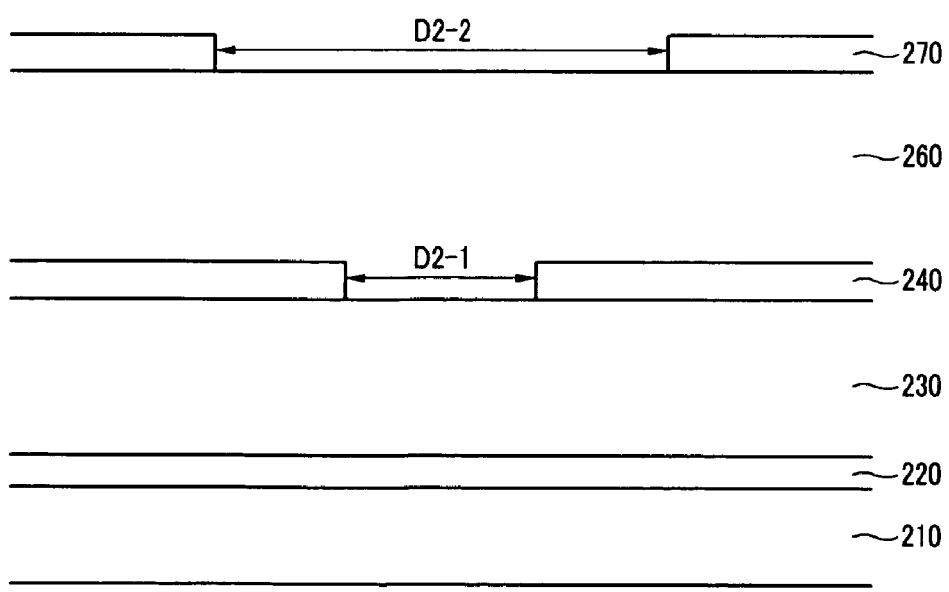

Referring to FIG. 3E, the hard mask layer 270 is etched by using the photosensitive layer pattern 280 as a mask to a degree that the upper insulation layer 260 is exposed.

Figure 3F:
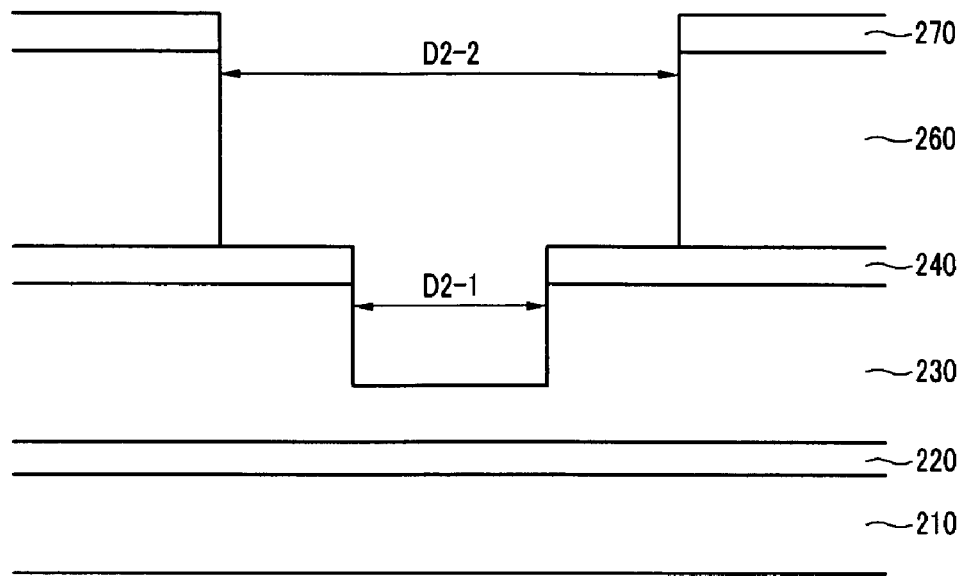

As shown in FIG. 3F, the inter-connection groove and a portion of the via hole are simultaneously formed by sequentially etching the upper insulation layer 260 and a portion of the lower insulation layer 230 using the hard mask layer 270 and the upper etch stop layer 240 as a mask.

Here, the etching of the lower insulation layer 230 is partially performed up to a portion thereof or is completely performed to a degree that the lower etch stop layer 220 is exposed.

Figure 3G:
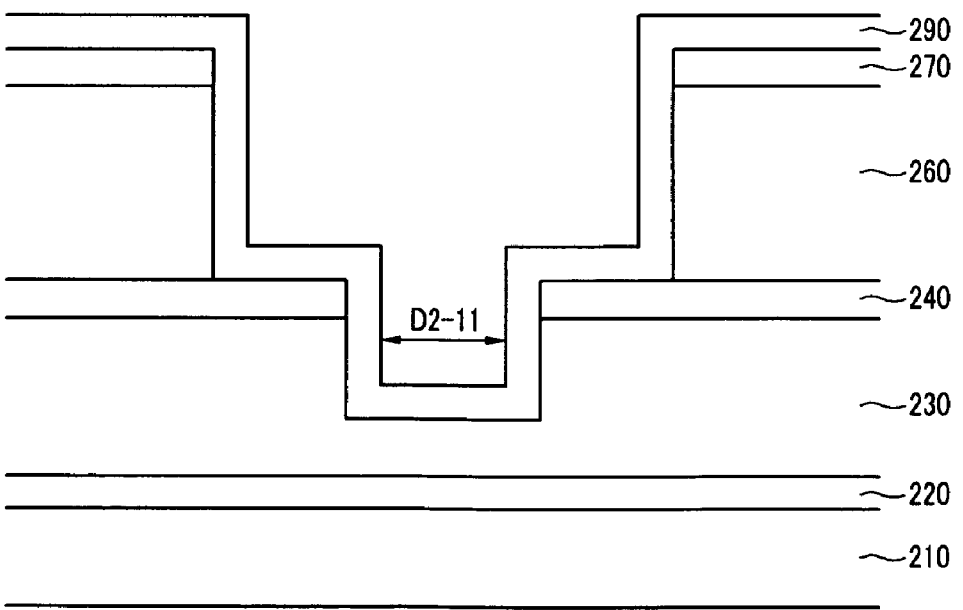

As shown in FIG. 3G, a spacer insulation layer 290 is formed on the entire surface of the substrate including the inter-connection groove and the via hole.

The spacer insulation layer 290 is composed of a material having the same etch rate as the hard mask layer 270, the upper etch stop layer 240, and the lower etch stop layer 220. According to the second exemplary embodiment of the present invention, the spacer insulation layer 290 is composed of silicon nitride.

Since the widths of the inter-connection groove and the via hole are determined by the width of the lower part of the spacer, they are adjusted by controlling the forming thickness of the spacer insulation layer 290.

Therefore, the inter-connection groove and via hole having a finer size than a size limit obtainable by a lithography process can be formed by adjusting the forming thickness of the spacer insulation layer 290.

Figure 3H:
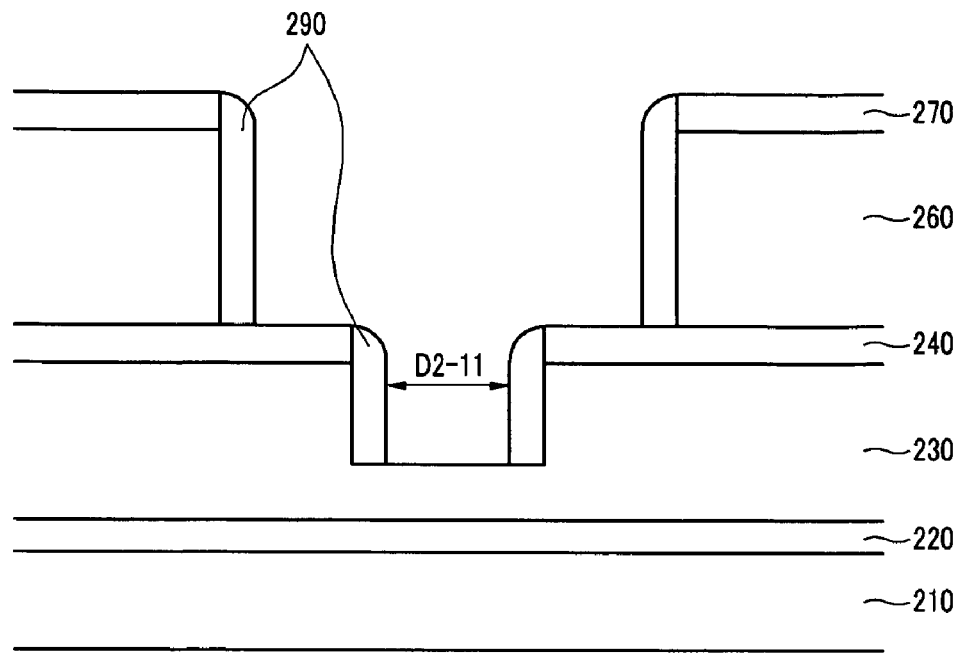

As shown in FIG. 3H, a spacer is formed at both sidewalls of the inter-connection groove and the via hole by performing an etch back process without a mask, using the thickness of the spacer insulation layer 290 as a target.

Figure 3I:
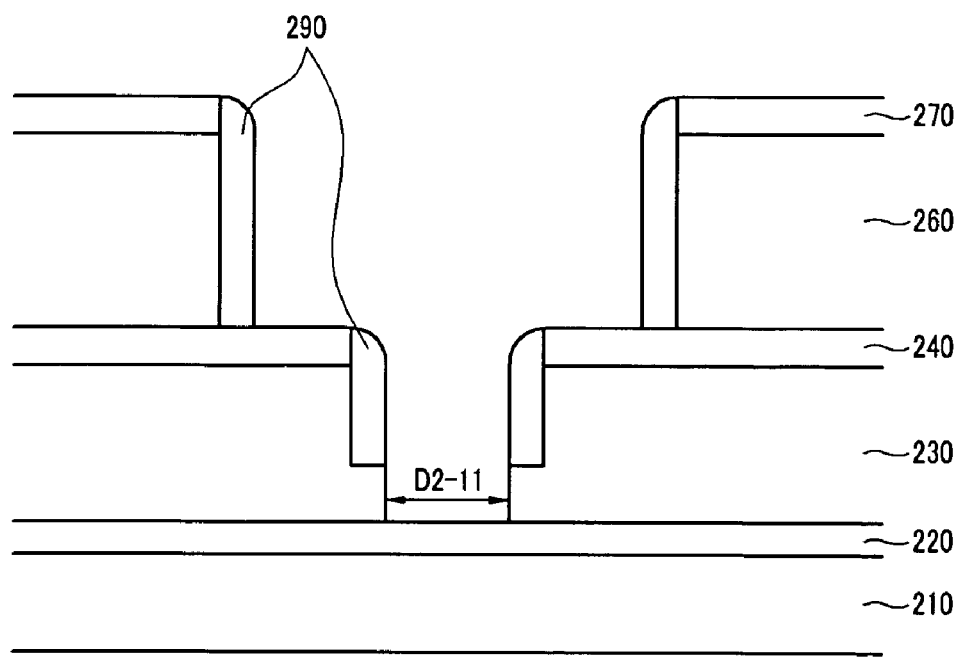

As shown in FIG. 3I, the final via hole having an opening D2-11 is formed by additionally etching the lower insulation layer 230 to a degree that the lower etch stop layer 220 is exposed.

Therefore, a via hole having a deep and fine opening can be formed in the semiconductor device by such a two step method.

Consequently, according to the second exemplary embodiment of the present invention, a part of the lower conductive layer 210 connected with the via hole, namely the thickness of the metal line, can be formed to a small thickness.

Figure 3J:
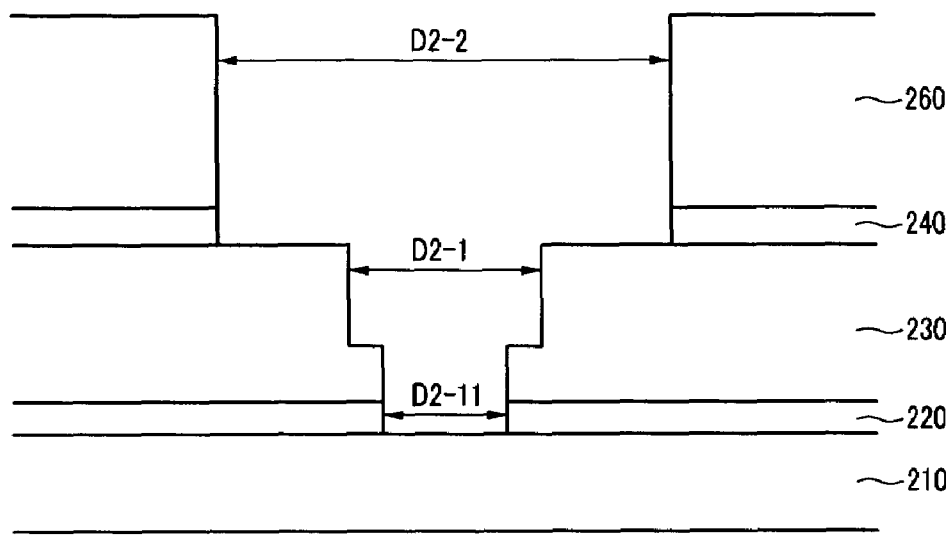

As shown in FIG. 3J, a damascene pattern composed of the inter-connection groove and via hole is finally formed by simultaneously removing the hard mask layer 270, the spacer insulation layer 290, the upper etch stop layer 240, and the lower etch stop layer 220 at the lower part of the via hole.

Here, according to the second exemplary embodiment of the present invention, since the hard mask layer 270, the spacer insulation layer 290, the upper etch stop layer 240, and the lower etch stop layer 220 are formed by using materials having the same etch selectivity, they can be removed simultaneously. In more detail, the hard mask layer 270, the spacer insulation layer 290, the upper etch stop layer 240, and the lower etch stop layer 220 are composed of silicon nitride, and they are simultaneously removed by dry etching or wet etching.

Figure 3K:
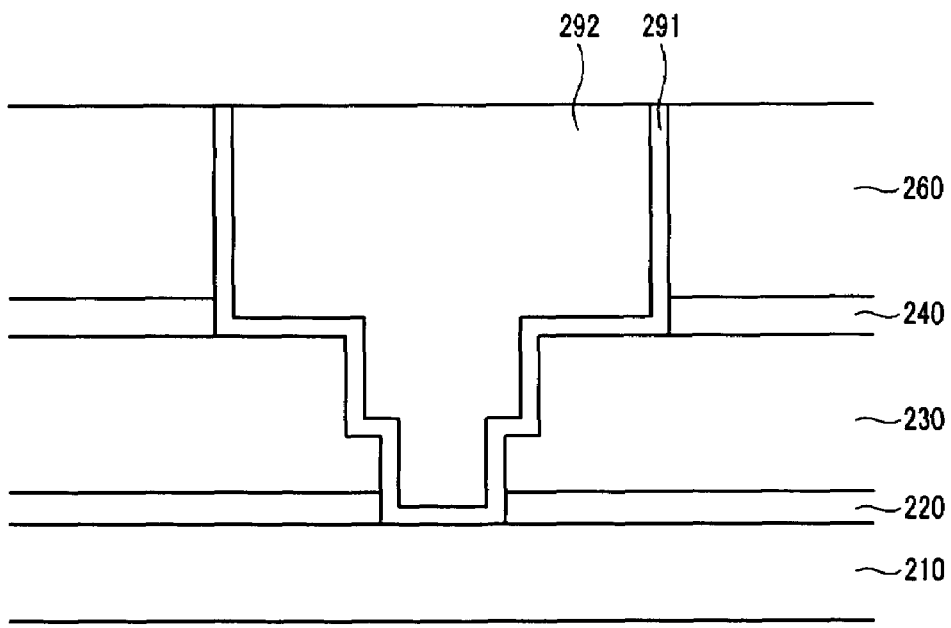

As shown in FIG. 3K, a metal line 292 is formed by polishing conductive materials filling the inter-connection groove and the via hole through a CMP process.

A metal line can be formed by using one among a method of reflowing a conductive layer which is formed by a sputter scheme, a CVD (Chemical Vapor Deposition) method, and an electroplating method.

When the electroplating method is used for forming a metal line, a seed layer can be formed in order to allow an electric current to flow during an electrolytic process.

In addition, a barrier metal layer 291 can be formed before conductive materials fill the inter-connection groove and the via hole. When a metal line is formed by a damascene process using copper (Cu), an insulation characteristic of an interlayer insulation layer can be degraded by diffusion of a copper conductive material. The barrier metal layer 291 prevents such degradation.

The barrier metal layer can be composed of at least one among Ta, TaN, TiN, WN, TaC, WC, TiSiN, or TaSiN, and it is formed by using one among PVD (Physical Vapor Deposition), CVD (Chemical Vapor Deposition), or ALD (Atomic Layer Deposition) schemes.

The exemplary embodiment of the present invention provides a method of forming a metal line in a semiconductor device in which damage to an insulation layer can be prevented.

In addition, since an inter-connection groove and a via hole having a finer size than a size limit obtained by the lithography process can be formed using a spacer, the reliability and yield of semiconductor devices can be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal line in a semiconductor device, comprising:

sequentially forming a first etch stop layer, a first insulation layer, and a second etch stop layer on a conductive layer;

forming a first photosensitive layer pattern having a first opening on the second etch stop layer;

etching the second etch stop layer by using the first photosensitive layer pattern as a mask to a degree that the first insulation layer is exposed, and then removing the first photosensitive layer pattern;

sequentially forming a second insulation layer and a third etch stop layer on the first insulation layer and the etched second etch stop layer, and forming a second photosensitive layer pattern having a second opening on the third etch stop layer;

etching the third etch stop layer by using the second photosensitive layer pattern as a mask to a degree that the second insulation layer is exposed, and removing the second photosensitive layer pattern;

simultaneously forming an inter-connection groove and a portion of a via hole by sequentially etching the second insulation layer and only a portion of the first insulation layer using the etched third etch stop layer and the etched second etch stop layer as a mask;

forming a spacer insulation layer on an entire surface of a substrate including the inter-connection groove and the portion of the via hole;

forming a spacer only at both sidewalls of the inter-connection groove and both sidewalls of the portion of the via hole by performing an etch back process using the thickness of the spacer insulation layer as a target;

forming the via hole by additionally etching the first insulation layer to a degree that the first etch stop layer is exposed;

simultaneously forming the inter-connection groove and the via hole by removing the exposed first etch stop layer, the etched second etch stop layer, the etched third etch stop layer, and the spacer; and forming a metal line by performing a CMP process for polishing conductive materials which fill in the inter-connection groove and the via hole.

2. The method of claim 1, wherein the first insulation layer or the second insulation layer is composed of an organic polymer having a low-k (low dielectric constant).

3. The method of claim 1, wherein the first insulation layer or the second insulation layer having the low-k (low dielectric constant) consists of one of a Si—O based inorganic polymer, a carbon-based organic polymer, a fluorine-doped oxide layer, and a carbon-doped oxide layer.

4. The method of claim 1, wherein, during the forming of the first photosensitive layer pattern and the second photosensitive layer pattern, the first insulation layer and the second insulation layer are protected by the second etch stop layer and the third etch stop layer in a rework process to remove the first photosensitive layer pattern or the second photosensitive layer pattern for performing an additional lithography process.

5. The method of claim 1, wherein the inter-connection groove and the via hole are simultaneously formed by performing etching with the use of the third etch stop layer pattern as a mask.

6. The method of claim 1, wherein the inter-connection groove and via hole having a finer size than a size limit obtained by a lithography process are formed by adjusting a thickness of the spacer.

7. The method of claim 1, wherein, before the conductive materials fill the inter-connection groove and the via hole, a barrier metal layer is formed at both sidewalls thereof.

8. The method of claim 7, wherein the barrier metal layer consists of at least one of Ta, TaN, TiN, WN, TaC, WC, TiSiN, and TaSiN.

9. The method of claim 1, wherein the first opening of the second photosensitive layer pattern has a width greater than a width of the via hole.

10. The method of claim 1, wherein removing the first photosensitive layer pattern includes an ashing process.

* * * * *